US008545712B2

(12) United States Patent
Takai et al.

(10) Patent No.: US 8,545,712 B2
(45) Date of Patent: Oct. 1, 2013

(54) SEMICONDUCTOR WAFER MANUFACTURING METHOD

(75) Inventors: Hiroshi Takai, Omura (JP); Kenji Satomura, Omura (JP); Yuichi Nakayoshi, Omura (JP); Katsutoshi Yamamoto, Omura (JP); Kouji Mizowaki, Omura (JP)

(73) Assignee: Sumco Techxiv Corporation, Omura-Shi (JP)

( * ) Notice: Subject to any disclaimer, the term of this patent is extended or adjusted under 35 U.S.C. 154(b) by 484 days.

(21) Appl. No.: 12/679,731

(22) PCT Filed: Sep. 11, 2008

(86) PCT No.: PCT/JP2008/066412
§ 371 (c)(1),
(2), (4) Date: Mar. 24, 2010

(87) PCT Pub. No.: WO2009/041277
PCT Pub. Date: Apr. 2, 2009

(65) Prior Publication Data
US 2010/0285665 A1 Nov. 11, 2010

(30) Foreign Application Priority Data
Sep. 25, 2007 (JP) .................................. 2007-247743

(51) Int. Cl.
*H01L 21/302* (2006.01)
*B44C 1/22* (2006.01)
(52) U.S. Cl.
USPC ................. 216/88; 216/84; 216/89; 438/692; 438/693

(58) Field of Classification Search
None
See application file for complete search history.

(56) References Cited

U.S. PATENT DOCUMENTS 5,110,428 A * 5/1992 Prigge et al. .................. 428/64.1
6,583,050 B2 * 6/2003 Wenski et al. ................. 438/626
6,852,012 B2 * 2/2005 Vepa et al. ...................... 451/41
(Continued)

FOREIGN PATENT DOCUMENTS
JP   10-329032 A    12/1998
JP   2000-235941 A   8/2000
(Continued)

OTHER PUBLICATIONS

International Preliminary Report on Patentability dated Apr. 7, 2010 (in English) in counterpart International Application No. PCT/JP2008/066412.
(Continued)

*Primary Examiner* — Anita Alanko
(74) *Attorney, Agent, or Firm* — Holtz, Holtz, Goodman & Chick, PC

(57) ABSTRACT

In a method of manufacturing semiconductor wafers, front and back surfaces of the semiconductor wafers are simultaneously polished with a double-side polishing machine that includes: a carrier for accommodating the semiconductor wafer; and an upper press platen and a lower press platen for sandwiching the carrier. The method includes: accommodating the semiconductor wafer in the carrier while a thickness of the semiconductor wafer is set to be larger than a thickness of the carrier by 0 μm to 5 μm; and polishing the semiconductor wafer while feeding a polishing slurry to between the surfaces of the semiconductor wafer and surfaces of the press platens. In the polishing, an allowance of both surfaces of the semiconductor wafer is set at 5 μm or less in total.

6 Claims, 3 Drawing Sheets

(56) References Cited

U.S. PATENT DOCUMENTS

| | | | |
|---|---|---|---|
| 7,371,686 B2* | 5/2008 | Arai | 438/691 |
| 7,579,261 B2* | 8/2009 | Schauer et al. | 438/478 |
| 2007/0179660 A1* | 8/2007 | Bhagavat et al. | 700/164 |
| 2010/0009605 A1* | 1/2010 | Taniguchi et al. | 451/63 |

FOREIGN PATENT DOCUMENTS

| | | |
|---|---|---|
| JP | 2001-328063 A | 11/2001 |
| JP | 2003-077870 A | 3/2003 |
| JP | 2006-068895 A | 3/2006 |
| JP | 2006-205265 A | 8/2006 |
| JP | 2006-303136 A | 11/2006 |
| WO | WO 0182354 A1 * | 11/2001 |
| WO | WO 2006/013996 A1 | 2/2006 |

OTHER PUBLICATIONS

International Search Report dated Dec. 2, 2008 issued in International Appln. No. PCT/JP2008/066412.

Japanese Journal of Applied Physics; Jan. 1999; vol. 38, No. 1A; Part 1; pp. 38-39.

Japanese Office Action dated Oct. 30, 2012 (and English translation thereof) in counterpart Japanese Application No. 2007-247743.

* cited by examiner

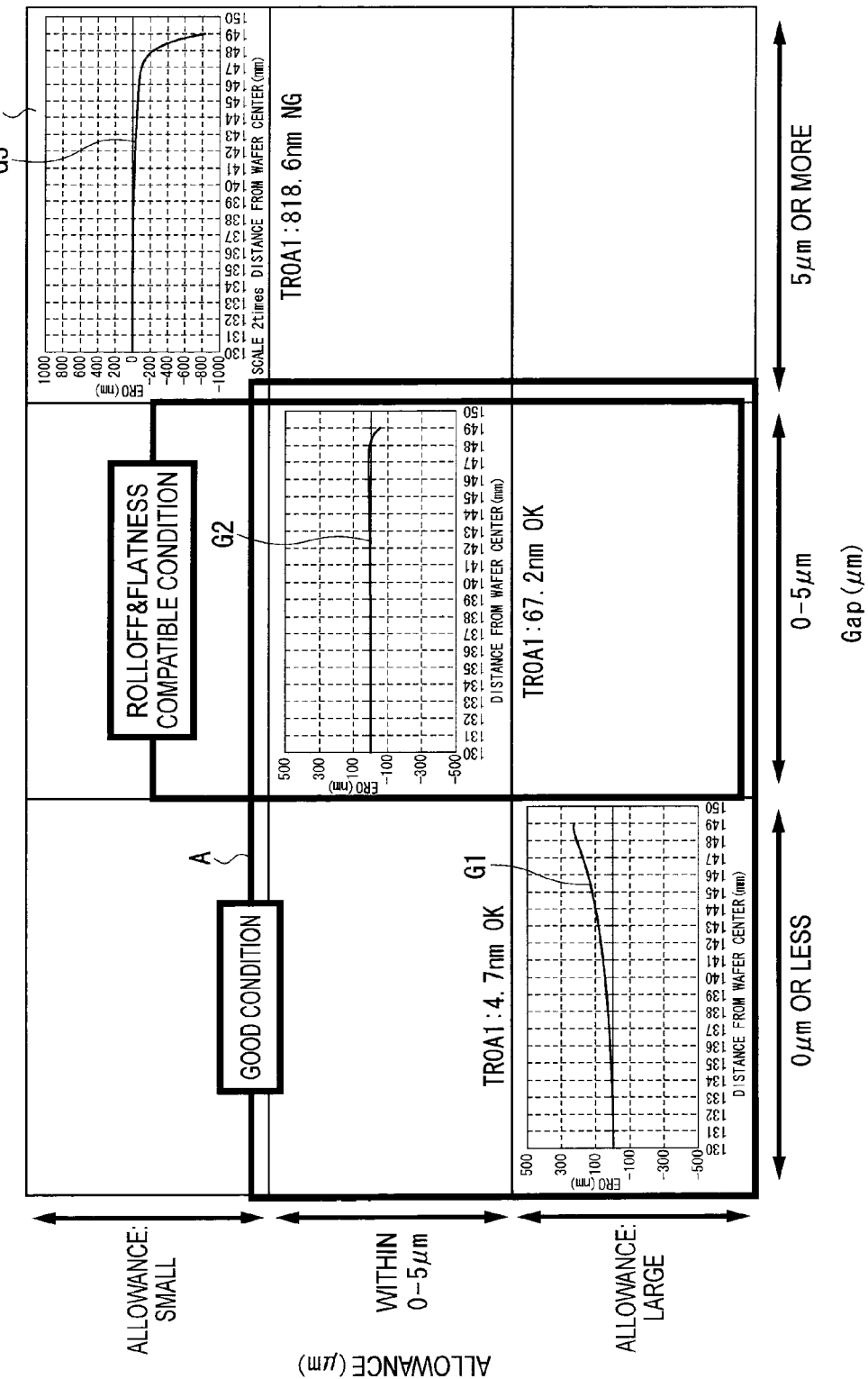

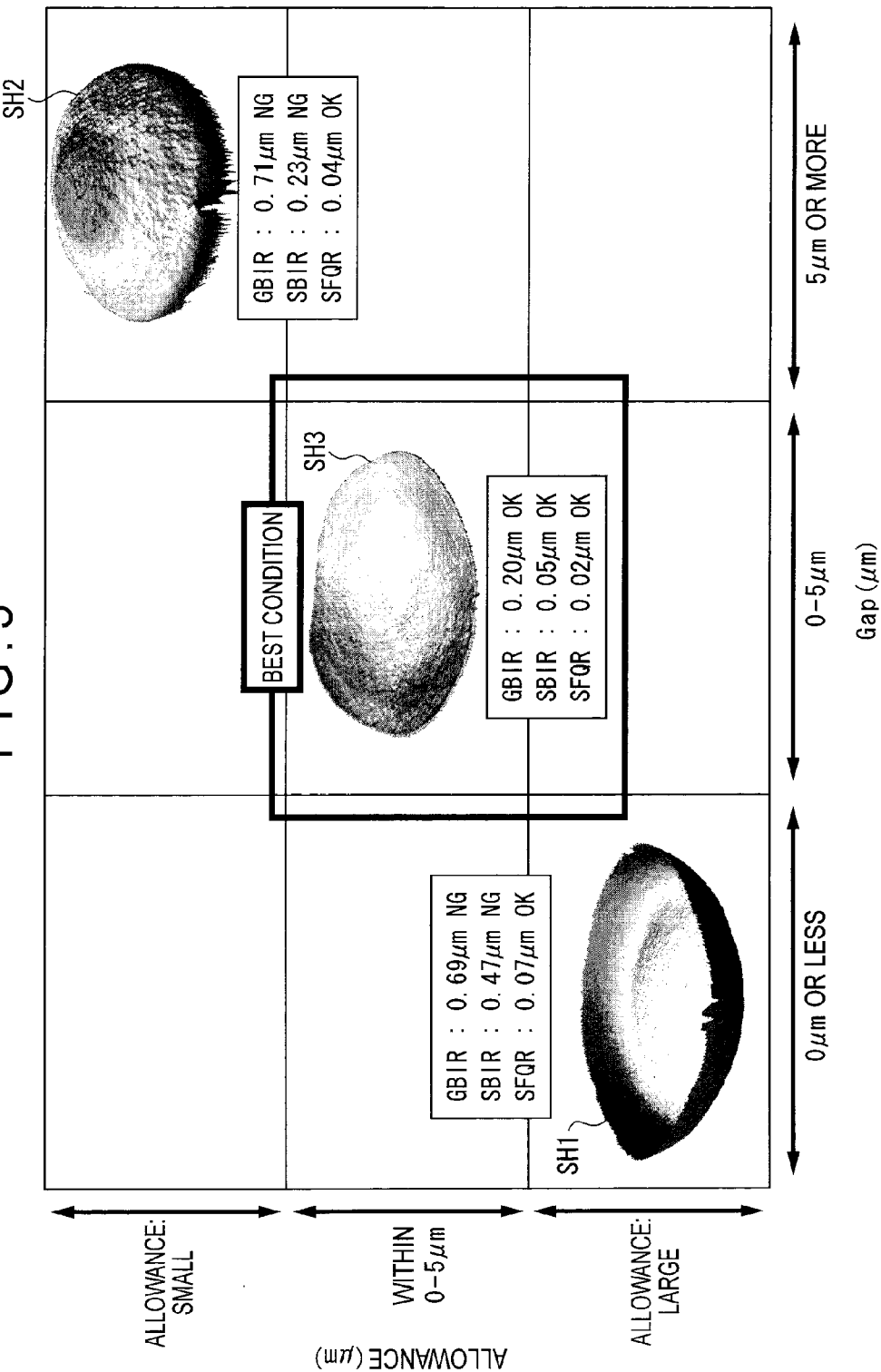

SEMICONDUCTOR WAFER MANUFACTURING METHOD

This application is a U.S. National Phase Application under 35 USC 371 of International Application PCT/JP2008/066412 filed Sep. 11, 2008.

TECHNICAL FIELD

The present invention relates to a method of manufacturing semiconductor wafers in which front and back surfaces of the semiconductor wafers are simultaneously polished with a double-side polishing machine that includes: a carrier for accommodating unprocessed semiconductor wafers; and an upper press platen and a lower press platen for sandwiching the carrier.

BACKGROUND ART

Increase in integration in semiconductor devices throughout recent years has invited reduction in line width of the semiconductor devices. In manufacturing such semiconductor devices with steppers, front surfaces of semiconductor wafers (i.e., exposure surfaces) are required to be highly flat.

The standard for evaluating the flatness has been hitherto GBIR (global back ideal range), a global standard, and SBIR (site back ideal range), a local standard. In recent years, semiconductor wafers are evaluated based on SFQR (site front-surface referenced least squares/range), a standard of the flatness in which focusing capabilities of the stepper over the whole segment regions of semiconductor wafer surfaces are considered.

According to a known proposal for a method of manufacturing semiconductor wafers capable of enhancing such SFQR, the relationship between the thickness of the carrier and the thickness of an unprocessed semiconductor wafer is defined during polishing by the double-side polishing machine, and a predetermined polishing allowance is secured, thereby enhancing SFQR (e.g., see Patent Document 1).

Patent Document 1: JP-A-2000-235941 (paragraph [0006])

DISCLOSURE OF THE INVENTION

Problems to Be Solved by the Invention

Ideally, every region in one piece of semiconductor wafer exhibits its required flatness. However, practically speaking, when a semiconductor wafer is polished with a double-side polishing machine or the like, the semiconductor wafer exhibits a phenomenon called edge roll off (ERO) at its edge region due to a difference in a polishing pressure between the central region and the edge region. Accordingly, a portion of the semiconductor wafer measured from the edge toward the center by a predetermined dimension does not exhibit the flatness level accorded with the demanded quality, so that the portion should be wastefully discarded.

With the technique disclosed in Patent Document 1, it is difficult to improve ERO while maintaining the flatness.

An aspect of the invention provides a method of manufacturing semiconductor wafers capable of enhancing utilization of edge regions of the semiconductor wafers while maintaining high flatness of the semiconductor wafers.

Means for Solving the Problems

According to an aspect of the invention, a new standard for evaluating ERO is used as the standards for evaluating semiconductor wafers in addition to the above-mentioned GBIR value, SBIR value and SFQR value. The aspect of the invention is based on a finding that the polishing condition optimum for securing high flatness in the entirety of a semiconductor wafer and for reducing the ERO amount in an outer circumference of the semiconductor wafer is derived from the above standards. In summary, the following methods are provided:

(1) a method of manufacturing semiconductor wafers wherein front and back surfaces of the semiconductor wafers are simultaneously polished with a double-side polishing machine, the double-side polishing machine including: a carrier for accommodating the semiconductor wafer; and an upper press platen and a lower press platen for sandwiching the carrier, the method including:

accommodating the semiconductor wafer in the carrier; and conducting a polishing in a plurality of steps of which polishing conditions are differently set, the polishing being conducted while a polishing slurry is fed to between the surfaces of the semiconductor wafer and surfaces of the press platens;

(2) the method according to (1), in which an allowance of both surfaces of the semiconductor wafer is set at 5 $\mu$m or less in total in a final polishing step of the polishing in the plurality of steps;

(3) the method of manufacturing a semiconductor wafer according to (2), in which the semiconductor wafer is accommodated in the carrier while a thickness of the semiconductor wafer prior to the final polishing step is set to be larger than a thickness of the carrier by 5 $\mu$m to 10 $\mu$m, and the semiconductor wafer is polished so that a thickness of the semiconductor wafer after the final polishing step becomes larger than the thickness of the carrier by 0 $\mu$m to 5 $\mu$m;

(4) A method of manufacturing semiconductor wafers wherein front and back surfaces of the semiconductor wafers are simultaneously polished with a double-side polishing machine, the double-side polishing machine including: a carrier for accommodating the semiconductor wafers; and an upper press platen and a lower press platen for sandwiching the carrier, the method including:

accommodating the semiconductor wafer in the carrier; and polishing the semiconductor wafer while feeding a polishing slurry to between the surfaces of the semiconductor wafer and surfaces of the press platens, in which in the polishing, the semiconductor wafer is accommodated in the carrier while a thickness of the semiconductor wafer prior to the polishing is set to be larger than a thickness of the carrier by 5 $\mu$m to 10 $\mu$m, and the semiconductor wafer is polished so that a thickness of the semiconductor wafer after the polishing becomes larger than a thickness of the carrier by 0 $\mu$m to 5 $\mu$m;

(5) the method according to (4), in which the semiconductor wafer is polished in the polishing so that SFQR becomes 0.015 $\mu$m to 0.030 $\mu$m and that SBIR becomes 0.04 $\mu$m to 0.1 $\mu$m;

(6) the method according to (4), in which the semiconductor wafer is polished in the polishing so that SFQR becomes 0.015 $\mu$m to 0.030 $\mu$m and that GBIR becomes 0.1 $\mu$m to 0.3 $\mu$m;

(7) the method according to (4), in which the semiconductor wafer is polished in the polishing so that SBIR becomes 0.04 $\mu$m to 0.1 $\mu$m and that ERO (edge roll off) becomes 0.2 $\mu$m or less;

(8) the method according to (4), in which the semiconductor wafer is polished in the polishing so that GBIR becomes 0.1 μm to 0.3 μm and that ERO (edge roll off) becomes 0.2 μm or less;

(9) the method according to any one of (4) to (8), in which a polishing time of the semiconductor wafer in the polishing is of such a length that abrasive grains and machine-attributable metals are not dispersed in the wafer;

(10) the method according to (2), in which the semiconductor wafer is polished in the final polishing step so that SFQR becomes 0.015 μm to 0.030 μm and that SBIR becomes 0.04 μm to 0.1 μm;

(11) the method according to (2), in which the semiconductor wafer is polished in the final polishing step so that SFQR becomes 0.015 μm to 0.030 μm and that GBIR becomes 0.1 μm to 0.3 μm;

(12) the method according to (2), in which the semiconductor wafer is polished in the final polishing step so that SBIR becomes 0.04 μm to 0.1 μm and that ERO (edge roll off) becomes 0.2 μm or less; and

(13) the method according to (2), in which the semiconductor wafer is polished in the final polishing step so that GBIR becomes 0.1 μm to 0.3 μm and that ERO (edge roll off) becomes 0.2 μm or less.

The allowance of the semiconductor wafer in the polishing and the final polishing step is set at 0 μm to 5 μm. In order to enhance the flatness of the entire semiconductor wafer, the allowance is preferably set at 1 μm or more, more preferably at 2 μm to 4 μm.

The above-mentioned ERO (edge roll off) is a thickness roll off amount (TROA) of a portion within 1 mm inward from the edge of the semiconductor wafer.

According to the aspect of the invention, utilization of the edge regions of the semiconductor wafers can be enhanced while high flatness of the semiconductor wafers is maintained.

BRIEF DESCRIPTION OF DRAWINGS

FIG. 2 is a graph showing a relationship between Gap and an allowance for the optimum ERO in Examples and Comparatives.

FIG. 3 is a graph showing a relationship between Gap and an allowance for the optimum flatness in Examples and Comparatives.

BEST MODE FOR CARRYING OUT THE INVENTION

Figure 1:
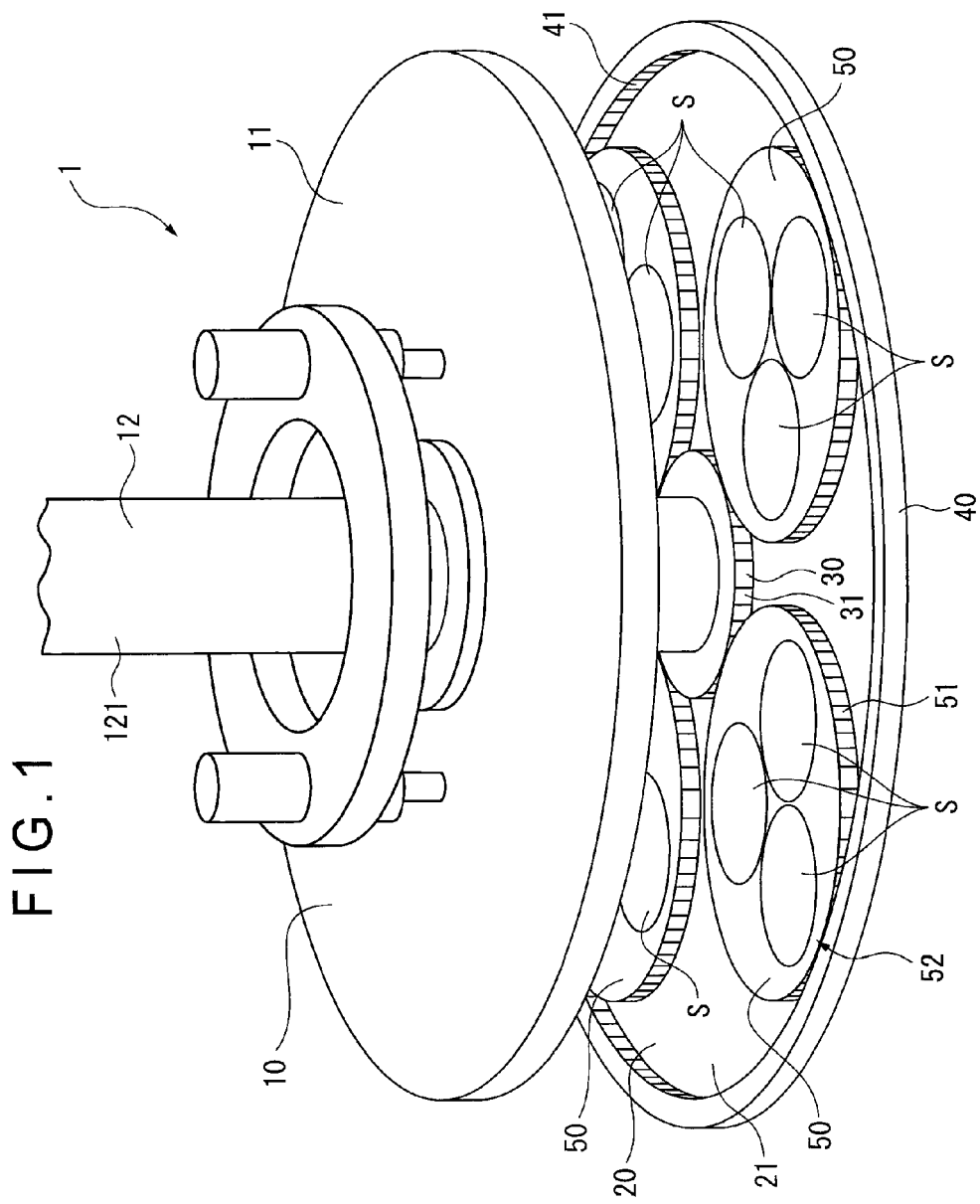
FIG. 1 is a perspective view schematically showing a double-side polishing machine according to an exemplary embodiment of the invention.

Exemplary embodiment(s) of the invention will be described below with reference to the attached drawings.

A double-side polishing machine 1 according to an exemplary embodiment of the invention, shown in FIG. 1, includes an upper press platen 10, a lower press platen 20, an inner gear 30, an outer gear 40 and a plurality of carriers 50. The carriers 50 accommodate a plurality of semiconductor wafers S.

The upper press platen 10 includes a press platen body 11 and an elevation mechanism 12 for moving the press platen body 11 closer to or away from the lower press platen 20.

The press platen body 11, which is shaped substantially in a disk, has a lower surface provided with an upper polishing pad (not shown in FIG. 1) for contacting surfaces of the semiconductor wafers S at the time of polishing the semiconductor wafers S. An upper surface of the press platen body 11 is provided with a plurality of apertures through which polishing slurry and rinsing pure water are supplied at the time of polishing. With this arrangement, the polishing slurry and the pure water are supplied to between the upper press platen 10 and the lower press platen 20.

The elevation mechanism 12 includes a shaft 121 provided substantially at the center of the press platen body 11. A motor provided on a portal frame (not shown) disposed at an upper position vertically elevates the press platen body 11.

The lower press platen 20, which is a disk body rotatably provided on a mount of the double-side polishing machine 1, has a lower polishing pad 21 at its surface opposed to the upper press platen 10. At the time of polishing, the lower polishing pad 21 contacts surfaces of the semiconductor wafers S.

The inner gear 30 is provided substantially at the disk center of the lower press platen 20 in a manner rotatable independently of the lower press platen 20. An outer circumference of the inner gear 30 is provided with teeth 31 meshed with the carriers 50.

The outer gear 40 is provided by a ring body surrounding the lower press platen 20, of which inner lateral surface is provided with teeth 41 meshed with the carriers 50.

The upper press platen 10, the lower press platen 20, the inner gear 30 and the outer gear 40 are respectively linked to rotation shafts of driving motors at their rotation centers, and rotated by the respective driving motors independently of one another.

The carriers 50, which are provided by disk bodies, have teeth 51 for meshing with the inner gear 30 and the outer gear 40 at their outer circumferences, and also have a plurality of apertures 52 internally in their disk bodies. The semiconductor wafers S are accommodated in the apertures 52.

At the time of polishing the semiconductor wafers S with the above double-side polishing machine 1, the carriers 50 are initially set on the lower press platen 20 and the semiconductor wafers S are accommodated in the apertures 52. Then, the upper press platen 10 is lowered with the elevation mechanism 12. While the upper press platen 10 is pressed downwardly at a predetermined pressure, the polishing slurry is fed through the apertures provided on the press platen body 11 of the upper press platen 10, and the driving motors are then driven for polishing both surfaces of the wafers. The semiconductor wafers S are disposed such that their front surfaces face downward while their back surfaces face upward. The polishing pad 21 attached to the lower press platen 20 is for polishing the front surfaces of the semiconductor wafers S, and the polishing pad attached to the upper press platen 10 is for polishing the back surfaces of the semiconductor wafers S.

EXAMPLES

Examples of the invention will be described below, but the invention is not limited thereto.

1. Example

Polishing Conditions

With use of the double-side polishing surface 1 of the above-described embodiment, semiconductor wafers S having a diameter of 300 mm were subjected to a dual-stage polishing. Specifically, in the first stage polishing, thicknesses of the semiconductor wafers S were larger than those of the carriers 50 by less than 5 μm. In the second stage polishing, the allowances of both surfaces of the semiconductor wafers S were totalized to be 5 μm or less. The polishing conditions in each stage were set as follows.

(1) Polishing Conditions in First Stage Polishing

In the first stage polishing, the same polishing pad was employed for the front and back surfaces. The employed polishing pad was an urethane pad.

The polishing conditions in the first stage polishing were: while feeding polishing slurry, polishing the semiconductor wafers S in four steps of STEPs 1 to 4 of which polishing pressure (Press), polishing time (Time), rotation number of the upper press platen (Upper), rotation number of lower press platen (Lower), rotation number of the inner gear 30 (Inner) and rotation number of the outer gear 40 (Outer) were different from one another; and finally cleaning the semiconductor wafers by rinsing with pure water (DIW) (STEP 5).

(2) Polishing Conditions in Second Stage Polishing

As in the first stage polishing, the polishing conditions of the second stage polishing were: polishing the wafers in the four steps of STEPs 1 to 4; and finally cleaning the wafers by rinsing with pure water (L5).

The first stage polishing were conducted at the polishing pressure of 1200 daN or more (i.e., condition shown in Table 1), and the second stage polishing were conducted at the polishing pressure of 1200 daN or less.

The sliding speed was set such that sliding speed 1/sliding speed 2 was in the range of 0.8 to 1.2, wherein: the sliding speed 1 represents a relative speed (mm/sec) of the carriers 50 and the upper press platen 10 at the center position of the carriers 50; and the sliding speed 2 represents a relative speed (mm/sec) of the carriers 50 and the lower press platen 20 at the center position of the carriers 50.

2. Comparative

In accordance with a hitherto-known method, semiconductor wafers S having a thickness larger than that of the carriers 50 by 10 μm or more were used, and the allowance was set at 20 μm or more for polishing.

In Example and Comparative, polishing was conducted while every carrier 50 was mounted with the semiconductor wafer S. Specifically, five carriers 50 mounted with the semiconductor wafers S were used for polishing. When the polishing pressure (Press) set in the double-side polishing machine 1 is converted into a surface pressure per one semiconductor wafer S, relationships shown in Table 1 below are obtained.

TABLE 1

Relationships between Polishing Pressure and Load Applied on Wafers per Unit Area

| Polishing Pressure (daN) | Load per Unit Area | |
|---|---|---|
| | Pa | gf/cm³ |
| 200 | 1882.9 | 19.2 |
| 400 | 3775.7 | 38.5 |
| 600 | 5858.6 | 57.7 |
| 800 | 7620.0 | 77.7 |
| 1000 | 9434.3 | 96.2 |
| 1200 | 11327.1 | 115.5 |
| 1400 | 13210.0 | 134.7 |
| 1500 | 14151.5 | 144.3 |
| 1600 | 15102.8 | 154.0 |
| 1800 | 16985.7 | 173.2 |
| 2000 | 18868.7 | 192.4 |
| 2200 | 20761.4 | 211.7 |
| 2400 | 22644.4 | 230.9 |
| 2600 | 24537.1 | 250.2 |
| 2800 | 26420.1 | 269.4 |
| 3000 | 28312.8 | 288.7 |

3. Evaluation Results and Consideration (1) Evaluation of Edge Roll Off (ERO) at Edge Region In Example and Comparative, the difference Gap between the thickness of the unprocessed semiconductor wafers S and the thickness of the carriers 50 and the allowances of both surfaces of the semiconductor wafers were changed in a stepwise manner, and the relationship therebetween shown in FIG. 2 was resultantly obtained. In FIG. 2, the horizontal axis represents radial positions (mm) distanced from the wafer center in the semiconductor wafer S having a diameter of 300 mm, and the vertical axis represents vertical positions (nm) distanced from the reference surface.

As appreciated from FIG. 2, the region A in which Gap was set at less than 5 μm and the allowance was set at 0 to 5 μm or more exhibited a quite favorable ERO value. As shown by the graphs G1 and G2 pertaining to Example, the region A exhibited ERO of 300 nm or less at a horizontal-axis position of 149 mm (i.e., position of TROA of 1 mm) in the graph G1 while exhibiting ERO of 100 nm or less at a position of TROA of 1 mm in the graph G2.

On the other hand, as shown by the graph G3 pertaining to Comparative, the region B in which Gap was set at 5 μm or more and the allowance was set at less than 0 to 5 μm exhibited ERO of −800 nm at a position of TROA of 1 mm, and generation of a great edge roll off was observed in the edge region.

Specifically, by conducting the dual-stage polishing as in Example and by mounting the carrier 50 with a semiconductor wafer S having a thickness larger than that of the carrier 50 by 5 μm or less and setting the allowance of both surfaces at 5 μm or less in total in the second stage polishing (i.e., final stage polishing), edge roll off in the edge region can be reduced. With this arrangement, utilization of the edge region of the semiconductor wafer S can be enhanced.

(2) Evaluation Based on GBIR Value, SBIR Value and SFQR Value

Next, the flatnesses of the surfaces of the semiconductor wafers S obtained from Example and Comparative were measured as GBIR value, SBIR value and SFQR value. The results are shown in Table 2.

TABLE 2

Relationship between Gap, Allowance and Flatness

| | Example | Comparative |
|---|---|---|
| Gap (μm) | Less than 5 μm | 10 μm or more |
| Allowance (μm) | 5 μm or less | 20 μm or more |
| GBIR | 0.1 to 0.3 μm | 0.4 to 1.2 μm |
| SBIR | 0.04 to 0.1 μm | 0.2 to 0.3 μm |
| SBIR (Partial) | approximately 0.045 μm | approximately 0.085 μm |
| SFQR | approximately 0.015 μm | approximately 0.022 μm |
| SFQR (Partial) | 0.015 to 0.030 μm | 0.035 to 0.045 μm |

The examination of the relationship between the thickness difference Gap and the allowance produced the result shown in FIG. 3.

Specifically, when Gap is set at 0 or less and the allowance is set at more than 5 μm, the center of the semiconductor wafer S tends to be polished more than the other portions while the periphery remains non-grinded, as represented by the shape SH1. Thus, GBIR, SBIR and SFQR are numerically deteriorated.

On the other hand, when Gap is set at 5 μm or more and the allowance is reduced, the edge portion of the semiconductor wafer S is polished more than the other portions while the center is little polished, as represented by the shape SH2. Thus, GBIR and SBIR are numerically deteriorated. Accordingly, by setting Gap at 5 μm (more than 0) and setting the allowance at 5 μm or less, the wafer can be flatly polished as represented by the shape SH3. Thus, all of GBIR, SBIR and SFQR are satisfied.

(3) Conclusion

In sum, based on the results in FIGS. 2 and 3, the conditions capable of satisfying all of ERO, GBIR, SBIR and SFQR are: to set Gap in a range of more than 0 μm to less than 5 μm; and to set the allowance of both surfaces to be totalized to be in a range of 5 μm or less.

By conducting the polishing under the above polishing conditions, semiconductor wafers S capable of satisfying all of ERO, GBIR, SBIR and SFQR can be manufactured.

The invention claimed is:

1. A method of manufacturing semiconductor wafers in which front and back surfaces of the semiconductor wafers are simultaneously polished with a double-side polishing machine, the double-side polishing machine including a carrier for accommodating the semiconductor wafer, and an upper press platen and a lower press platen for sandwiching the carrier, wherein the method comprises:

accommodating the semiconductor wafer in the carrier; and conducting a double-side simultaneous polishing in a plurality of steps in which polishing conditions are differently set, the polishing being conducted while a polishing slurry is fed to between the back surface of the semiconductor wafer and a surface of the upper press platen, and between the front surface of the semiconductor wafer and a surface of the lower press platen;

wherein, in a final step of the plurality of steps of the double-side simultaneous polishing, a difference between a thickness of the semiconductor wafer and a thickness of the carrier is set in a range of more than 0 μm to less than 5 μm, and wherein a polishing amount of both surfaces of the semiconductor wafer is set at 5 μm or less in total in the final step of the plurality of steps of the double-side simultaneous polishing.

2. The method according to claim 1, wherein a polishing time of the semiconductor wafer in the polishing is of such a length that abrasive grains and machine-attributable metals are not dispersed in the wafer.

3. The method according to claim 1, wherein the semiconductor wafer is polished in the final polishing step so that SFQR becomes 0.015 μm to 0.030 μm and SBIR becomes 0.04 μm to 0.1 μm.

4. The method according to claim 1, wherein the semiconductor wafer is polished in the final polishing step so that SFQR becomes 0.015 μm to 0.030 μm and GBIR becomes 0.1 μm to 0.3 μm.

5. The method according to claim 1, wherein the semiconductor wafer is polished in the final polishing step so that SBIR becomes 0.04 μm to 0.1 μm and ERO (edge roll off) becomes 0.2 μm or less.

6. The method according to claim 1, wherein the semiconductor wafer is polished in the final polishing step so that GBIR becomes 0.1 μm to 0.3 μm and ERO (edge roll off) becomes 0.2 μm or less.

* * * * *